US011640961B2

(12) United States Patent
Dewey et al.

(10) Patent No.: US 11,640,961 B2
(45) Date of Patent: May 2, 2023

(54) III-V SOURCE/DRAIN IN TOP NMOS TRANSISTORS FOR LOW TEMPERATURE STACKED TRANSISTOR CONTACTS

(71) Applicant: Intel Corporation, Santa Clara, CA (US)

(72) Inventors: Gilbert Dewey, Beaverton, OR (US); Ravi Pillarisetty, Portland, OR (US); Jack T. Kavalieros, Portland, OR (US); Aaron D. Lilak, Beaverton, OR (US); Willy Rachmady, Beaverton, OR (US); Rishabh Mehandru, Portland, OR (US); Kimin Jun, Portland, OR (US); Anh Phan, Beaverton, OR (US); Hui Jae Yoo, Hillsboro, OR (US); Patrick Morrow, Portland, OR (US); Cheng-Ying Huang, Portland, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 187 days.

(21) Appl. No.: 16/954,126

(22) PCT Filed: Mar. 28, 2018

(86) PCT No.: PCT/US2018/024936
§ 371 (c)(1),
(2) Date: Jun. 16, 2020

(87) PCT Pub. No.: WO2019/190508
PCT Pub. Date: Oct. 3, 2019

(65) Prior Publication Data
US 2021/0057413 A1 Feb. 25, 2021

(51) Int. Cl.
*H01L 27/092* (2006.01)
*H01L 21/822* (2006.01)
(Continued)

(52) U.S. Cl.
CPC ...... *H01L 27/0924* (2013.01); *H01L 21/8221* (2013.01); *H01L 21/823807* (2013.01);
(Continued)

(58) Field of Classification Search
CPC ............... H01L 27/0924; H01L 27/092; H01L 27/0688; H01L 21/8221; H01L 21/823821;
(Continued)

(56) References Cited

U.S. PATENT DOCUMENTS

2002/0190284 A1\* 12/2002 Murthy ................. H01L 29/456
257/E29.054
2006/0115944 A1 6/2006 Kwak et al.
(Continued)

FOREIGN PATENT DOCUMENTS

CN 106098689 11/2016
CN 106098689 B \* 7/2019
(Continued)

OTHER PUBLICATIONS

International Preliminary Report on Patentability for International Patent Application No. PCT/US2018/024936, dated Oct. 8, 2020, 11 pgs.
(Continued)

*Primary Examiner* — Michael M Trinh
(74) *Attorney, Agent, or Firm* — Schwabe, Williamson & Wyatt, P.C.

(57) ABSTRACT

An integrated circuit structure comprises a lower device layer that includes a first structure comprising a plurality of PMOS transistors. An upper device layer is formed on the
(Continued)

lower device layer, wherein the upper device layer includes a second structure comprising a plurality of NMOS transistors having a group III-V material source/drain region.

15 Claims, 9 Drawing Sheets

(51) Int. Cl.

| | |
|---|---|
| *H01L 21/8238* | (2006.01) |
| *H01L 29/78* | (2006.01) |
| *H01L 27/06* | (2006.01) |
| *H01L 29/06* | (2006.01) |
| *H01L 29/08* | (2006.01) |
| *H01L 29/66* | (2006.01) |

(52) U.S. Cl.
CPC ........... *H01L 21/823814* (2013.01); *H01L 21/823821* (2013.01); *H01L 27/0688* (2013.01); *H01L 29/0669* (2013.01); *H01L 29/0847* (2013.01); *H01L 29/66818* (2013.01); *H01L 29/785* (2013.01)

(58) Field of Classification Search
CPC ..... H01L 21/823814; H01L 21/823807; H01L 29/785; H01L 29/267; H01L 29/0847; H01L 29/66545; H01L 29/66439
See application file for complete search history.

(56) References Cited

U.S. PATENT DOCUMENTS

| | | | |
|---|---|---|---|
| 2016/0056291 A1* | 2/2016 | Yokoyama | H01L 23/53257 257/77 |
| 2020/0105751 A1* | 4/2020 | Dewey | H01L 27/092 |
| 2020/0212038 A1* | 7/2020 | Rachmady | H01L 27/092 |

FOREIGN PATENT DOCUMENTS

| | | |
|---|---|---|
| EP | 1624487 | 2/2006 |
| WO | WO-2014209278 | 12/2014 |
| WO | WO-2017218015 | 12/2017 |
| WO | WO 2019/190505 A1 * | 10/2019 |

OTHER PUBLICATIONS

International Search Report and Written Opinion for International Patent Application No. PCT/US2018/024936 dated Jan. 10, 2019, 14 pgs.

* cited by examiner

III-V SOURCE/DRAIN IN TOP NMOS TRANSISTORS FOR LOW TEMPERATURE STACKED TRANSISTOR CONTACTS

CROSS-REFERENCE TO RELATED APPLICATION

This patent application is a U.S. National Phase Application under 35 U.S.C. § 371 of International Application No. PCT/US2018/024936, filed Mar. 28, 2018, entitled "III-V SOURCE/DRAIN IN TOP NMOS TRANSISTORS FOR LOW TEMPERATURE STACKED TRANSISTOR CONTACTS," which designates the United States of America, the entire disclosure of which is hereby incorporated by reference in its entirety and for all purposes.

TECHNICAL FIELD

Embodiments of the disclosure are in the field of integrated circuit structures and, in particular, III-V source/drain in top NMOS transistors for low temperature stacked transistor contacts.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors have become more prevalent as device dimensions continue to scale down. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1:
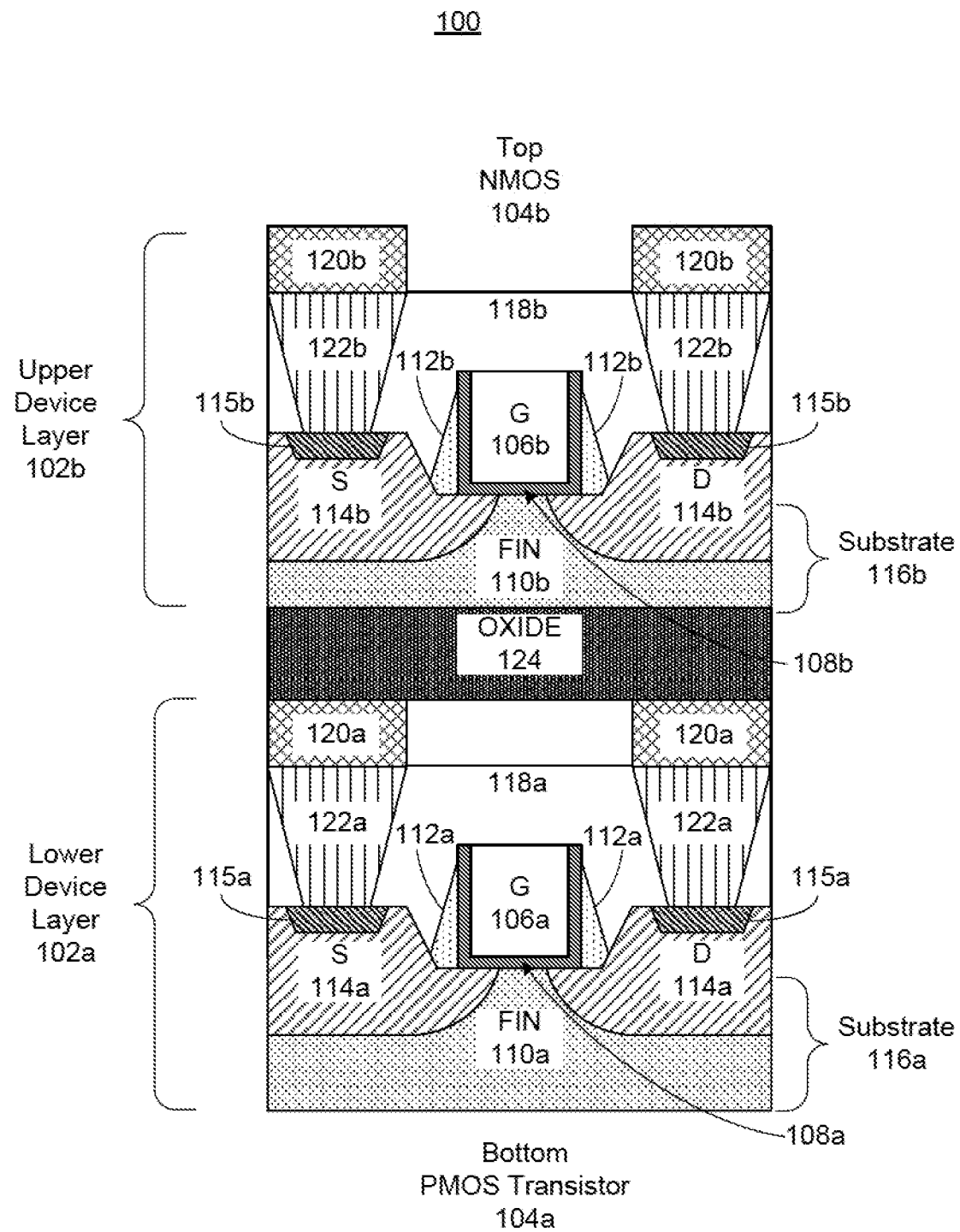
FIG. 1 is a three-dimensional view illustrating a gate-cut cross-section of a stacked device architecture according to one embodiment.

Group III-V source/drain in top NMOS transistors for low temperature stacked transistor contacts are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating vertically stacked transistor devices. Embodiments may include or pertain to one or more of stacked transistors, high-density transistors, CMOS, and group III-V materials. One or more embodiments may be implemented to realize high performance stacked transistors potentially to increase monolithic integration in SoCs of future technology nodes.

In accordance with one or more embodiments described herein, top NMOS transistors having group III-V source/drain material for low temperature stacked transistor contacts is disclosed. In one aspect a lower device layer that includes a first plurality of PMOS transistors, and an upper device layer formed on the lower device layer that comprises a second plurality of NMOS transistors that can be fabricated without negatively affecting the lower PMOS transistors. The present embodiments improve on known approaches for fabricating stacked transistor architectures.

FIG. 1 is a three-dimensional view illustrating a gate-cut cross-section of a stacked device architecture according to one embodiment. The stacked device architecture 100 comprises vertically stacked non-planar transistor devices formed in a lower device layer 102a and in an upper device layer 102b. The lower device layer 102a includes a first plurality of transistors 104a, which comprise Si PMOS transistors in one embodiment. Transistors 104a have a gate electrode 106a formed on a gate dielectric layer 108a formed on a fin 110a or channel. A pair of sidewall spacers 112a are formed along laterally opposite sidewalls of gate electrode 106a. In FIG. 1, the fin 110a runs horizontally across the page, while the gate 106b runs in a z-direction into the page and wraps around the fin 110a. A pair of source and drain region 114a are formed on opposite sides of gate electrode 106a. As illustrated in FIG. 1, the source and drain region 114a laterally extend completely beneath spacers 112a and slightly extend beneath or undercut the gate dielectric 108a and gate electrode 106a. When forming a p type field effect transistor (FET) where the majority carriers are holes, the silicon is doped to a p type conductivity. Silicide regions 115a are formed in the source and drain region 114a.

An interlayer dielectric 118a is formed over and around transistor 104a that isolates the transistor 104a from levels of metallization 120a used to interconnect the transistors 104a into function circuits, such as microprocessors, digital signal processors and memory devices. Metal contacts 120a and contact metal 122a are formed through the interlayer dielectric 118a and directly contact the silicide 115a formed on the source and drain region 114a to provide electrical connection between the first level of metallization 120a and the source and drain region 114a.

The upper device layer 102b includes a second structure comprising a second plurality of transistors 104b, which comprise NMOS transistors in one embodiment. Transistors 104b generally have the same structural components as transistors 104a in the lower device layer 102a except that when forming an n type FET where the majority carriers are electrons, the silicon is doped to an n type conductivity.

The upper device layer 102b is bonded onto the lower device layer 102a. Accordingly, the upper device layer 102b includes a bonding layer material, which may comprise an oxide layer 124. In further details, in one embodiment the lower-level of transistors are conventionally fabricated, and then a second layer of monocrystalline silicon or other semiconductor material may be layer transferred and oxide-oxide low temperature bonded to the top of the lower-level interlayer dielectric 118a.

While the vertically stacked non-planar transistor devices 102a and 102b work for their intended purpose, the total time and temperature, referred to as "dT", for all processing steps required to fabricate the top NMOS transistors 104b can negatively impact performance of the bottom transistors 104a. For example, when forming the fin 110b during fabrication, there is an etch and epitaxial regrowth of the source and drain 114b that is heated to greater than 600° for 15 minutes followed by a spike in temperature of 700 C to 1000° for approximately two seconds to activate the dopants. Such a level of dT affects the gate stack and contact metal of the bottom transistors 104a. For example, the silicide regions 115a may continue to defuse and become less conductive when continually subjected to heat. In addition, the dT may cause the dopant atoms to continue to defuse which may shrink the gate length and make the transition from undoped to doped material less abrupt. Consequently, the channel is harder to control and/or makes it harder to turn the bottom PMOS transistor 118a on and off. There are techniques in the art to limit the dT, but those techniques result in a performance penalty to the top NMOS transistor 114b.

According to the disclosed embodiments, a stacked integrated circuit structure is provided in which the top NMOS transistors are replaced with NMOS transistors having group III-V materials in the source/drain region in the upper device layer to significantly reduce the dT that damages the PMOS transistors in the bottom device layer.

Figure 2:
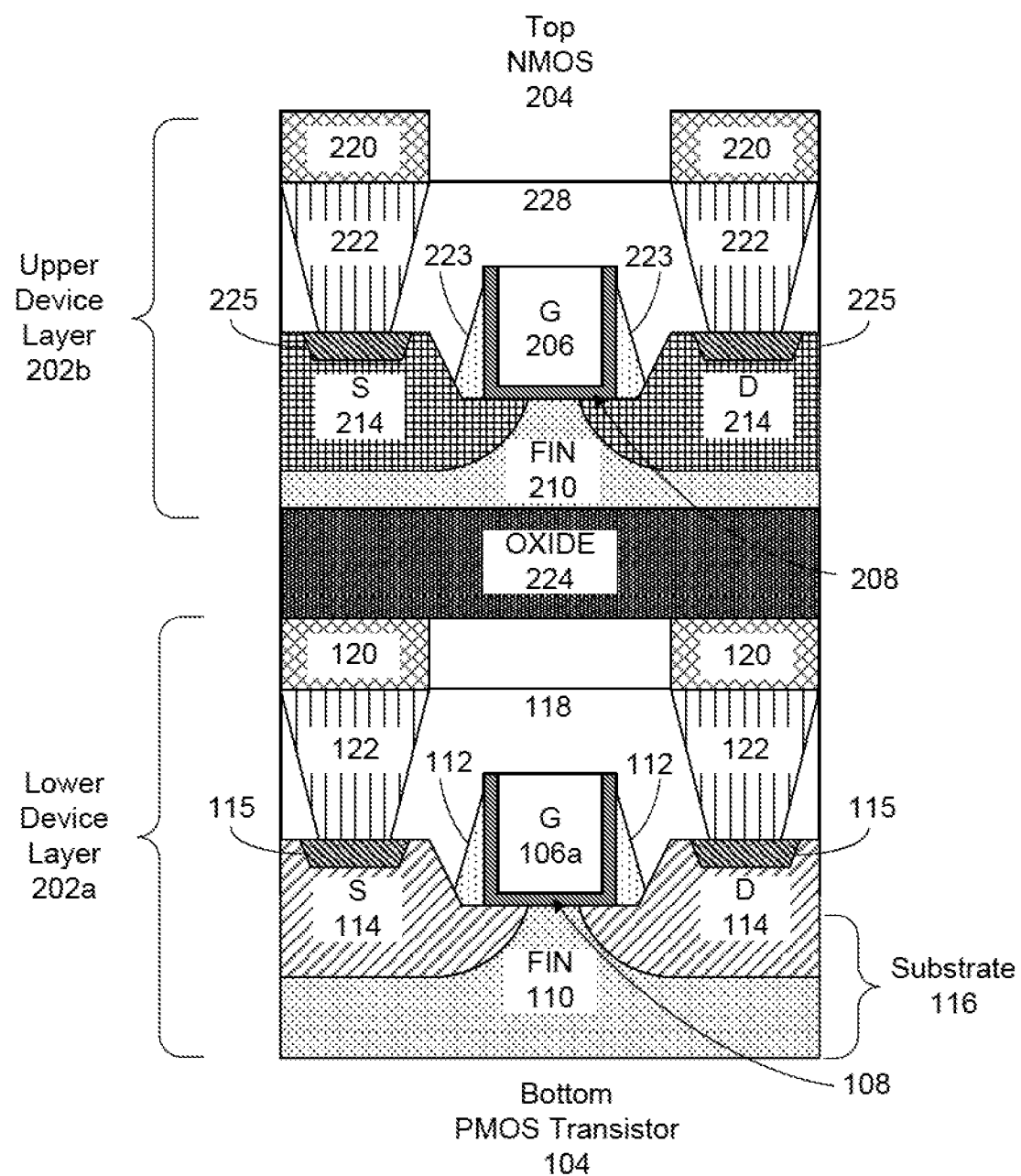
FIG. 2 is a three-dimensional view illustrating a gate-cut cross-section of a stacked device architecture according to another embodiment, where like components from FIG. 1 correspond have like reference numerals.

FIG. 2 is a three-dimensional view illustrating a gate-cut cross-section of a stacked device architecture according to another embodiment, where like components from FIG. 1 correspond have like reference numerals. An integrated circuit structure is shown in FIG. 1 comprising a stacked device architecture 200 of vertically stacked transistor devices formed in a lower device layer 202a and in an upper device layer 202b. The lower device layer 202a includes a first structure comprising a plurality of PMOS transistors 104. However, according to the present embodiment, the top NMOS transistors 104b in the upper device layer 102b shown FIG. 1 are replaced with NMOS transistors having low band gap group III-V materials in the source/drain region 214 that do not require high fabrication temperatures. Accordingly, the upper device layer 202b is formed on the lower device layer 202a and includes a second structure comprising a plurality of NMOS transistors 204 having a group III-V source/drain region 214.

In one embodiment, the group III-V material of the source/drain region 214 comprises a narrow band gap alloy of indium gallium arsenide ($In_xGa_yAs_y$). In one embodiment, the narrow band gap alloy of $In_xGa_yAs_y$ has indium to gallium content ratio of approximately where the gallium content decreases as the indium content increases. For example, in one embodiment, the narrow band gap alloy of $In_xGa_yAs_y$ has indium to gallium content ratio of approximately 25% to 50%. In another embodiment, the narrow band gap alloy of $In_xGa_yAs_y$ has indium to gallium content ratio of approximately 50% to 70%. In other embodiments, the group III-V material of the source/drain region 214 may comprise indium arsenide (InAs), indium antimony (InSb), indium arsenide antimony (InAsSb), gallium arsenide (GaAs), gallium arsenide antimony (GaAsSb), indium phosphorus (InP).

In one embodiment, the NMOS transistors 204 include a gate electrode 206 formed on a gate dielectric layer 208 formed on a fin 210. A pair of gate sidewall spacers 223 is formed along opposite sides of the gate electrode 206. A pair of source/drains, referred to as source/drain region 214, is formed on opposite sides of and extending beneath the gate electrode 206. The source/drain region 214 is also formed adjacent to the gate sidewall spacers 223 and above a bottom surface of the gate dielectric layer 208.

In some embodiments, the fin 210 is formed from a silicon (Si) substrate that is bonded to the oxide 224, which is advantageous for monolithic integration of finFETs. Crystallographic orientation of a substantially monocrystalline substrate 105 in exemplary embodiments is (100), (111), or (110). However, other crystallographic orientations are also possible. For example, the substrate working surface may be miscut, or offcut 2-10° toward [110] to facilitate nucleation of crystalline heteroepitaxial material. Other substrate embodiments are also possible. For example, the substrate may be any of silicon-carbide (SiC), sapphire, III-V compound semiconductor (e.g., GaAs), silicon on insulator (SOI), germanium (Ge), or silicon-germanium (SiGe).

Fin 210 or the channel region is disposed below (or covered by) gate electrode 206 and gate dielectric 208. As illustrated in FIG. 2, a metal-insulator gate stack includes the gate dielectric material 208 and the gate electrode material 206. While any known gate stack materials may be utilized, in one exemplary embodiment a high-k material having a bulk relative dielectric constant of 9, or more is employed as the gate dielectric along with a gate metal that has a work function suitable for the composition of channel region 120. Exemplary high-k materials include metal oxides, such as, but not limited to HfC. In the embodiments illustrated by FIG. 2, gate dielectric 208 is disposed directly on sidewalls of fin 210 that define the transverse fin width Wf. The gate sidewall spacers 223 may be of any dielectric material, and may be in contact with a sidewall of gate electrode 206, or as shown, in contact with gate dielectric 208 that covers sidewalls of gate electrode 173. The lateral dimensions of gate sidewall spacers 223 may vary anywhere from 1 to 10 nm, for example. In some exemplary embodiments, gate sidewall spacers 223 may provide 2-5 nm of lateral spacing between gate electrode 206 and semiconductor source/drain region 214.

In one embodiment, a first plurality of PMOS transistors 104 in the lower device layer 202a include a gate electrode 106 formed on a gate dielectric layer 108 formed on a fin 110. A pair of gate sidewall spacers 112 is formed along opposite sides of the gate electrode 106. A source/drain region 114 is formed on opposite sides of and extending beneath the gate electrode 106. The pair of source/drain region 114 is also formed adjacent to the sidewall spacers 112 and above a top surface of the gate dielectric layer 108. In one embodiment, transistor 104 is formed in a silicon-on-insulator (SOI) substrate 116a that includes a thin silicon film formed on a buried oxide layer, which in turn is formed on a monocrystalline silicon substrate. In another embodiment, transistor 104a is formed in a silicon layer that is part of a monocrystalline silicon substrate, which is sometimes referred to as "a bulk" transistor.

For both the NMOS transistor 204 and the PMOS transistor 104, an interlayer dielectric 228 and 118, respectively, is formed over and around transistor 204, 104 that isolates the transistors 204, 104 from levels of metallization 220, 120 used to interconnect the various transistors 204. Metal contacts 222, 122 or are formed through the interlayer dielectric 228, 118 to provide electrical connection between the first level of metallization 220, 120 and the source and drain region 214, 114. For the PMOS transistor 104, the metal contacts 122 directly contact silicide 225. For the NMOS transistor 204, the metal contacts 222 directly contact the group III-V material source/drain region 214.

According to one embodiment, the group III-V materials are introduced after an epitaxial undercut is performed in the silicon, as shown by curved shape silicon under the gate 206. The undercut in the silicon is performed to control both the activation in the dopant and the dopant density, and the source and drain region 214 is then regrown using group III-V materials.

Group III-V low band gap semiconductor materials typically have higher mobility, lower epitaxial growth temperatures, and lower temperatures required to activate the dopants. Consequently, the stacked transistor architecture with top high mobility NMOS transistors 204 having III-V source/drain region 214 over bottom PMOS transistors 104 of the present embodiments has several advantages. As mentioned above, one advantage is that replacing Si source/drains regions with group III-V source/drain region 214 significantly reduces or eliminates the dT that damages the PMOS transistors in the bottom device layer. This because formation of the source and drain region typically requires the highest temperatures and requires the longest times to form and to acquire active high dopant, particularly in silicon. For example, silicon growth typically requires a temperature ranging from 650 C to 800 C. Group III-V materials, in contrast, have lower band gaps and thus have a lower temperature for growth. Growth of the epi source/drain regions 214 comprising group III-V materials, such as indium arsenide, can be grown and dopants become highly active at temperatures of less than 475 C. Such low temperature processes should not result in any degradation of performance of the bottom PMOS transistors 104.

A further advantage is that the contact resistance or external resistance when using a group III-V material as a contact is the same as or better than using a high temperature silicon source/drain region, which requires a temperature range of 700 C and 1000 C for activation. As stated above, the group III-V material source/drain region 214 only requires 475 C for activation. Accordingly, the active resistance or the external resistance of the NMOS transistor 204 will be low, which significantly reduces, if not eliminate, the negative impact of fabrication temperatures on bottom PMOS transistor 104 performance.

Lastly, because group III-V materials have narrow band gaps, when the metal contact 222 is placed on the group III-V material source/drain region 214, the group III-V materials tend to pin close to the interfacial conduction band edge (Ec), which means there is minimal Schottky barrier height. Therefore, the metal contact 22 placed on the group III-V material source/drain region 214 has a lower contact resistivity than a metal contact placed on silicon. In one embodiment, the group III-V material source/drain region 214 has a contact resistivity between approximately 3e-10 and 1e-8 $\Omega$-cm$^2$. Accordingly, the present embodiments use of the group III-V material provides the benefit of reducing the highest temperature budget for processing the stack of top NMOS on bottom PMOS (due to low temperature requirements), while providing a lower contact resistivity than a typical NMOS silicon transistor 104b. This means that the metal for the top contacts can be selected for process ease and low resistivity, without the need for a silicide.

Notably, the architectural elements described above in the context of NMOS transistors 204 may be applied to a wide array of other finFET architectures. For example, FIG. 2 depicts a finFET 204 having a regrown source/drain region 214. In one embodiment, both the NMOS transistors 204 and the PMOS transistors 104 are non-planar transistors. In an alternative embodiment, one or both of the PMOS transistors 104 and the NMOS transistors 204 may be planar transistors. However, in preferred embodiments, any combination of non-planar transistor architectures may be stacked. For example, in one embodiment, the first plurality of PMOS transistors 104 and the second plurality of NMOS transistors 204 are formed as at least one of finFET, multi-gate, vertical circular gate (CG), and nanowire, respectively. In another embodiment, the same type of transistor architecture are used for both the first plurality of PMOS transistors 104 and the second plurality of NMOS transistors 204, such that both the first plurality of PMOS transistors 104 and the second plurality of NMOS transistors 204 are formed using non-planar transistor geometries that may include but are not limited to at least one of finFET, multi-gate, vertical circular gate (CG), and nanowire.

Stacked PMOS and NMOS finFETs in accordance with the architectures above may be fabricated by a variety of methods applying a variety of techniques and processing chamber configurations. The process may begin by forming a lower device layer 202a that includes a first structure comprising a plurality of PMOS transistors 104. After the lower device layer 202a is formed, a bonding layer material is formed on the lower device layer. An upper device layer 202b is then formed on the bonding layer material, where the upper device layer includes a second structure comprising a plurality of NMOS transistors having a group III-V material source/drain region.

Figure 3:
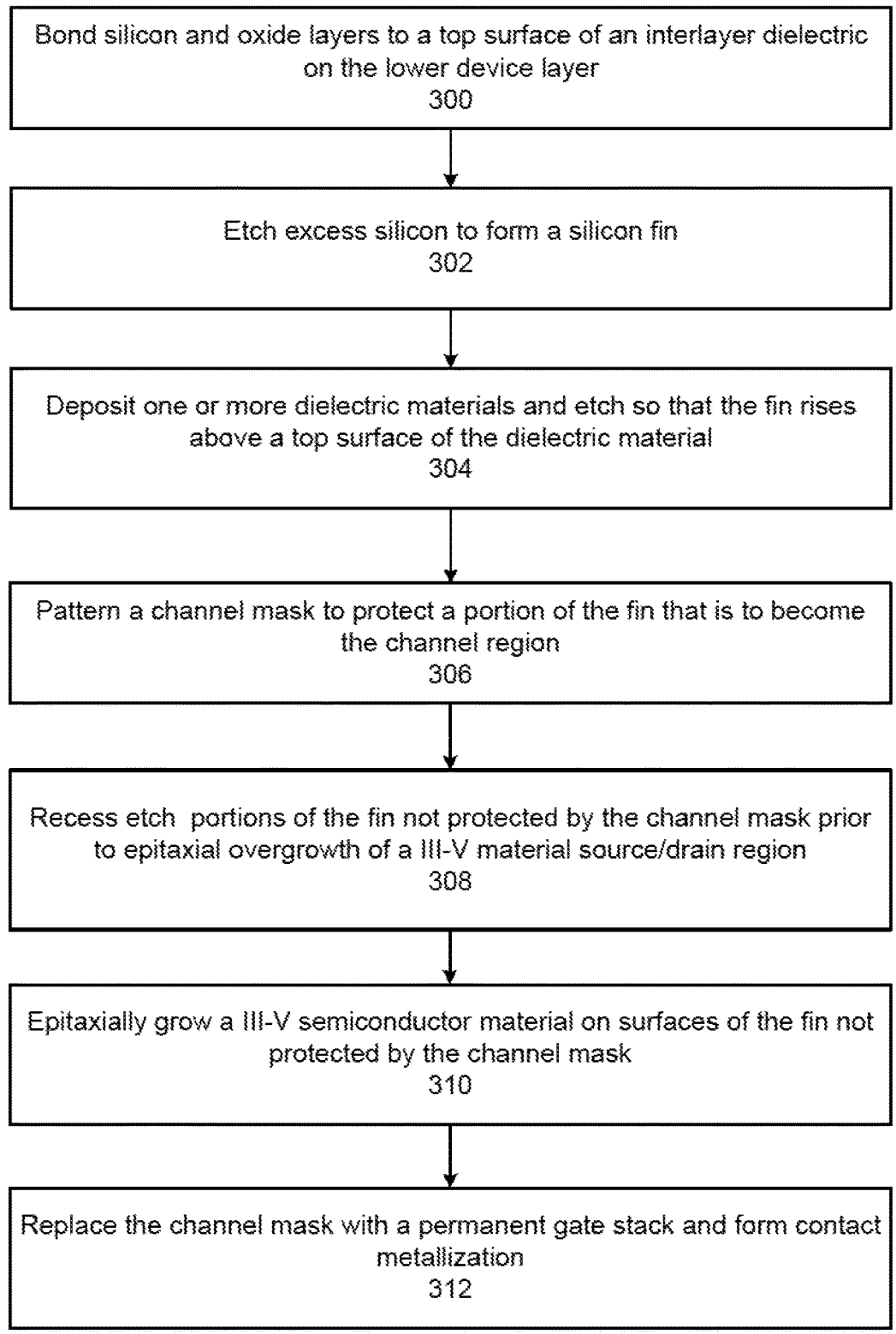
FIG. 3 is a flow diagram illustrating an exemplary process for fabricating a top NMOS transistor having a group III-V material source/drain region in a stacked device architecture with bottom PMOS transistors, in accordance with some embodiments of the present disclosure.

FIG. 3 is a flow diagram illustrating an exemplary process for fabricating a top NMOS transistor having a group III-V material source/drain region in a stacked device architecture with bottom PMOS transistors, in accordance with some embodiments of the present disclosure. FIGS. 4A-4E illustrate cross-sectional views of the top NMOS transistor evolving as the fabrication process is performed, in accordance with some embodiments.

Referring to FIG. 3, the process of forming the upper device layer 202b with the top NMOS transistor 204 may begin by bonding a silicon and oxide layers to a top surface of the interlayer dielectric 118 on the lower device layer 202a (block 300). An oxide is first grown on a low-density silicon wafer. In one embodiment, the silicon may comprise a monocrystalline silicon or other semiconductor material. A hydrogen implant is performed and the silicon with the oxide layer is cleaved off the wafer, polished, and then low temperature bonded with the oxide face down to the top of interlayer dielectric 118 on the lower device layer 202a. The thickness of the layer of silicon is variable but needs to be at least as thick enough to accommodate a height of a fin and to leave room for polishing. In one embodiment, the layer silicon may have a height between approximately 20 to 50 nm.

Figure 4A:
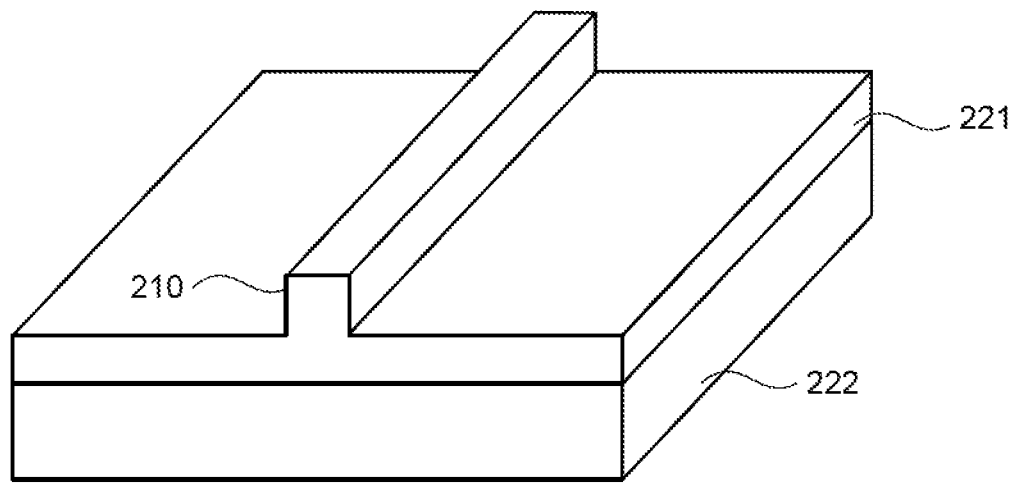
FIGS. 4A-4F illustrate cross-sectional views of the top NMOS transistor evolving as the fabrication process is performed, in accordance with some embodiments.

The process continues by etching away excess silicon to form a silicon fin (block 302). The fins may be formed with any well-known technique such as masking and a wet or dry etching process. FIG. 4A shows a fin 210 formed from the silicon layer 221. Though a single fin 210 is shown, it should be noted that multiple fins may be formed according to disclosed embodiments. The fin 210 may be substantially rectangular, but other embodiments are not so limited. In one embodiment, the fin 210 have a height between approximately 10 to 40 nanometers and have widths between approximately 5 nanometers and 20 nanometers.

Figure 4B:
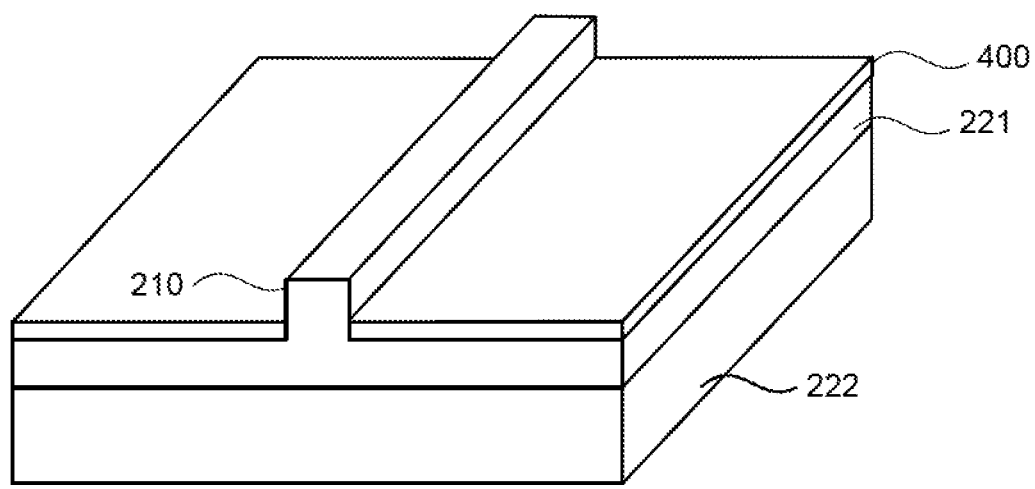

Referring again to FIG. 3, one or more dielectric materials is deposited and etched so that the fin 210 rises above a top surface of the dielectric material (block 304). In the case of multiple fin 210s, trenches formed between the fins 210 are filled with the dielectric material. In one embodiment, the dielectric material may comprise an oxide Any portions of the dielectric material extending above the fin 210s may be planarized with the top surface of the fin 210s using a planarization process, such as chemical-mechanical planarization. The dielectric material is then etched back to allow the fin to extend above a top surface of the dielectric material. FIG. 4B shows the fin 210 rising above a top surface after deposition and etching of the dielectric material 400.

Referring again to FIG. 3, the process continues by patterning a channel mask to protect a portion of the fin that is to become the channel region (block 306). While any known masking technique and material(s) may be employed, in some embodiments, the channel mask is a gate mandrel retained through a number of processes until being replaced in a "gate-last" finFET fabrication flow. Such embodiments may be advantageously compatible with silicon-channeled finFET fabrication, for example enabling PMOS transistors to be concurrently fabricated in other regions of the substrate (not depicted).

Figure 4C:
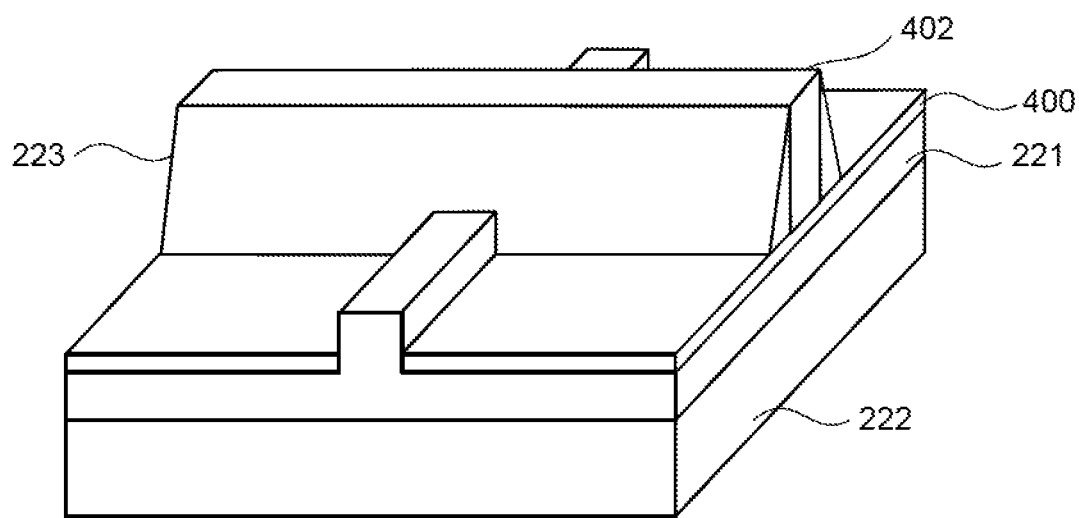
Figure 4D:
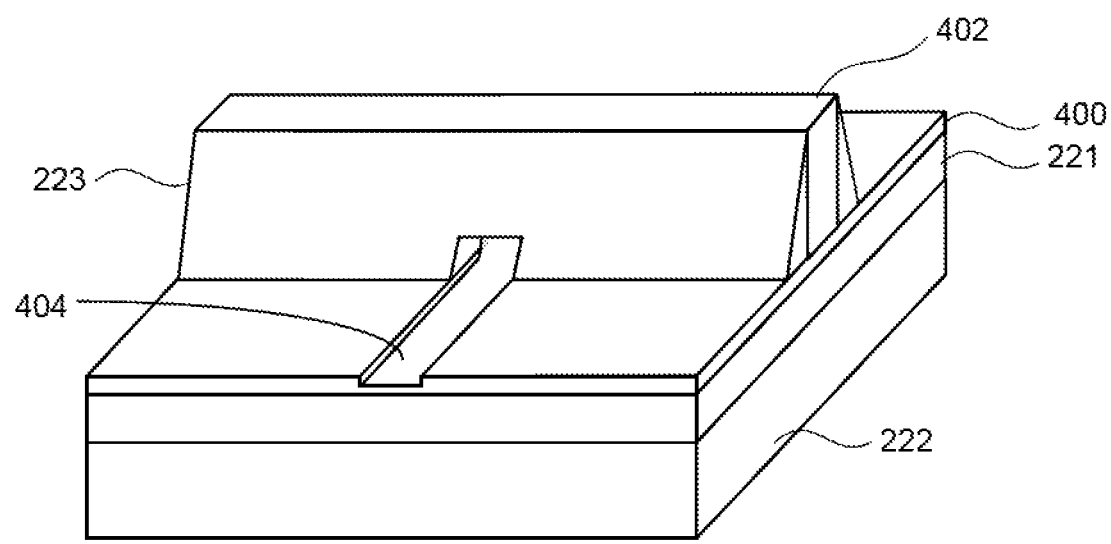
Figure 4E:
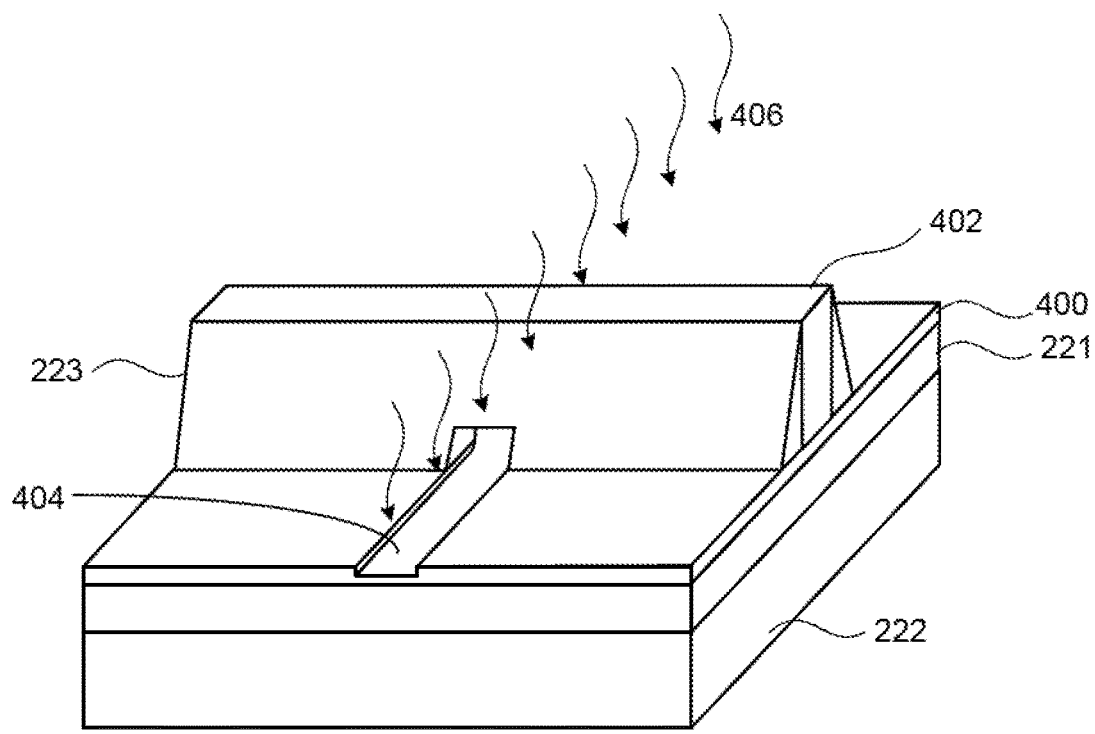

In the exemplary embodiment illustrated in FIG. 4C, a sacrificial gate 402 is formed over a portion of the hetero-fin 103. Any known sacrificial gate structure and fabrication techniques may be employed at operation 306 to form sacrificial gate 402 on at least two opposing sidewalls of fin 210. Sacrificial gate 402 is patterned into a stripe of sacrificial material extending over the channel region. Other portions of the fin 210 are exposed, as shown. In one embodiment, the gate width which is approximately 30 nanometers. In further embodiments, the channel mask further includes a gate sidewall spacer 223 adjacent to sacrificial gate 402. Any conventional self-aligned lateral spacer process may be employed at operation 306 to laterally stand-off subsequent processing from sacrificial gate 402. For example, a dielectric (e.g., silicon dioxide and/or silicon nitride) may be conformally deposited over the fin 210 and over the channel mask. An anisotropic etch is then employed to clear the dielectric except along edged of topography.

Returning to FIG. 3, portions of the fin 210 not protected by the channel mask are recess etched prior to epitaxial overgrowth of a III-V material source/drain region to form recesses (block 308). In the example illustrated by FIG. 4D, portions fin 120 not protected by the channel mask are recessed etched forming recess 404. According to one embodiment, the etching process that forms the source/drain recess 404 may extend below the lateral spacer 223 and optionally the sacrificial date 402 by some predetermined amount to form an undercut. A crystallographic wet etchant may be employed or a low damage, chemical dry etchant, for example. It should be readily understood by those of ordinary skill in the art that different depths of the source/drain recesses 404 may be chosen in order to optimize a given device for a desired purpose.

Figure 4F:
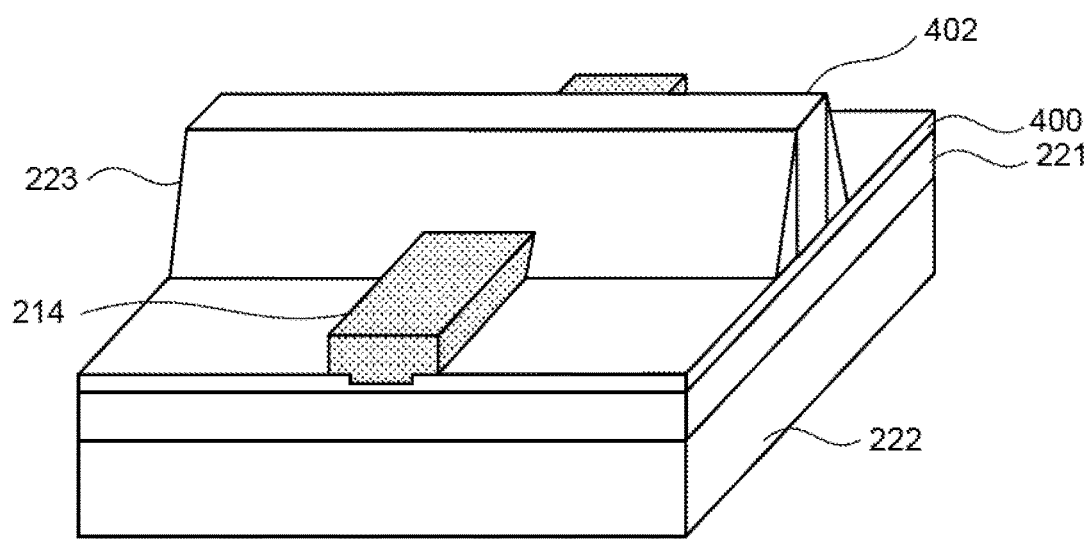

Returning to FIG. 3, the process continues by epitaxially growing a III-V semiconductor material on surfaces of the fin not protected by the channel mask (block 310). As further illustrated in FIG. 4E, a III-V material is overgrown by a low temperature epitaxial growth process 406, e.g. less than 475 C, to form a raised source/drain region 214. Any of metal-organic chemical vapor deposition (MOCVD), molecular beam epitaxy (MBE), hydride vapor phase epitaxy (HYPE), or the like, may be employed to grow the III-V semiconductor material with in-situ impurity doping. In some embodiments, a ternary source/drain material, such as $In_x$-$Ga_y$As or indium arsenide (InAs), indium antimony (InSb), indium arsenide antimony (InAsSb), gallium arsenide (GaAs), gallium arsenide antimony (GaAsSb), indium phosphorus (InP), germanium (Ge), or silicon germanium (SiGe), is grown to form n-type material. FIG. 4F illustrates the raised III-V source/drain region 214 formed over the top surface of the recesses 404 and dielectric 400.

Returning to FIG. 3, the process continues by replacing the channel mask with a permanent gate stack and forming contact metallization (block 312). For the exemplary embodiment, this may be accomplished by depositing and planarizing finFET isolation to expose a top of sacrificial gate 770. Sacrificial gate is removed selectively relative to the isolation, thereby exposing the lateral channel region. A permanent gate stack including a gate dielectric 208 and gate electrode 206 is formed over at least two sidewalls of the fin structure. The metal contacts 222 are formed on the source/drain region 214 for example by depositing Ti and/or TiN on a narrow band gap III-V source/drain cap. The structure of the NMOS finFET is then substantially as introduced in FIG. 2, and is ready for backend processing following any known techniques.

In an embodiment, gate electrode 206 includes at least one N-type work function metal for the N-type transistor. For an N-type transistor, metals that may be used for the gate electrode 206 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode includes a stack of two or more metal layers, where one or more metal layers are work function metal layers and at least one metal layer is a fill metal layer. Further metal layers may be included for other purposes, such as to act as a barrier layer. In some implementations, the gate electrode 206 may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, gate dielectric layer 208 is composed of a high-K material. For example, in one embodiment, the gate dielectric layer 208 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In some implementations, the gate dielectric 208 may consist of a "U"-shaped structure that includes a bottom portion substantially parallel to the surface of the substrate and two sidewall portions that are substantially perpendicular to the top surface of the substrate.

In an embodiment, dielectric spacers 223 are formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used. For example, two pairs, three pairs, or four pairs of sidewall spacers may be formed on opposing sides of the gate electrode 206.

In an embodiment, metal contacts 222 act as contacts to source/drain region of the fin or nanowire, or act directly as source/drain region. The metal contacts 222 may be spaced apart by a distance that is the gate length of the transistor 204. In some embodiments, the gate length is between 7 and 30 nanometers. In an embodiment, the metal contacts 222 include one or more layers of metal and/or metal alloys. In a particular embodiment, the metal contacts 222 are composed of aluminum or an aluminum-containing alloy.

In another aspect, the integrated circuit structures described herein may be included in an electronic device. As a first example of an apparatus that may include the III-V source/drain in top NMOS transistors for low temperature stacked transistor contacts disclosed herein, FIGS. 5A and 5B are top views of a wafer and dies that include stacked bottom PMOS transistors and III-V source/drain in top NMOS transistors for low temperature stacked transistor contacts, in accordance with any of the embodiments disclosed herein.

Figure 5B:
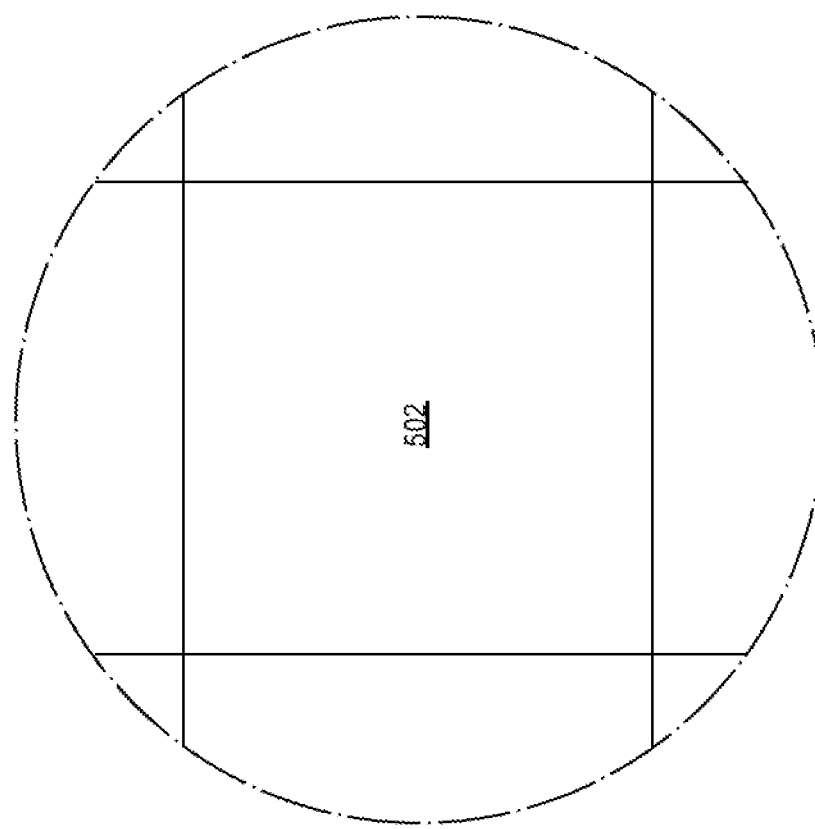
FIGS. 5A and 5B are top views of a wafer and dies that include stacked bottom PMOS transistors and III-V source/drain in top NMOS transistors for low temperature stacked transistor contacts, in accordance with any of the embodiments disclosed herein.
Figure 5A:
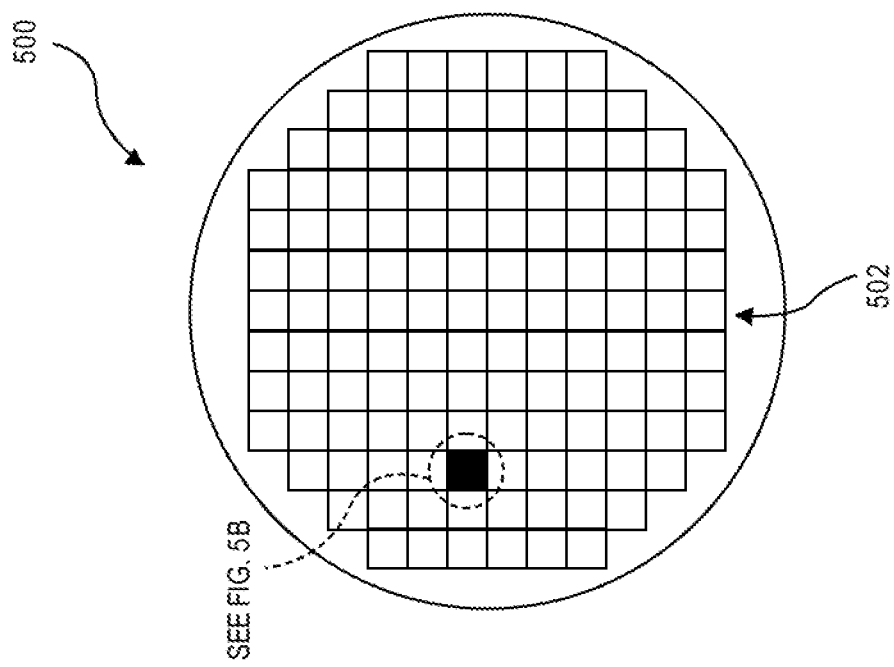

Referring to FIGS. 5A and 5B, a wafer 500 may be composed of semiconductor material and may include one or more dies 502 having integrated circuit (IC) structures formed on a surface of the wafer 500. Each of the dies 502 may be a repeating unit of a semiconductor product that includes any suitable IC (e.g., ICs including one or more structures such as structures 150, 170, 200 or 300). After the fabrication of the semiconductor product is complete (e.g., after manufacture of structures 150, 170, 200 or 300), the wafer 500 may undergo a singulation process in which each of the dies 502 is separated from one another to provide discrete "chips" of the semiconductor product. In particular, devices that include III-V source/drain in top NMOS transistors as disclosed herein may take the form of the wafer 500 (e.g., not singulated) or the form of the die 502 (e.g., singulated). The die 502 may include one or more transistors and/or supporting circuitry to route electrical signals to the transistors, as well as any other IC components. In some embodiments, the wafer 500 or the die 502 may include a memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Figure 6:
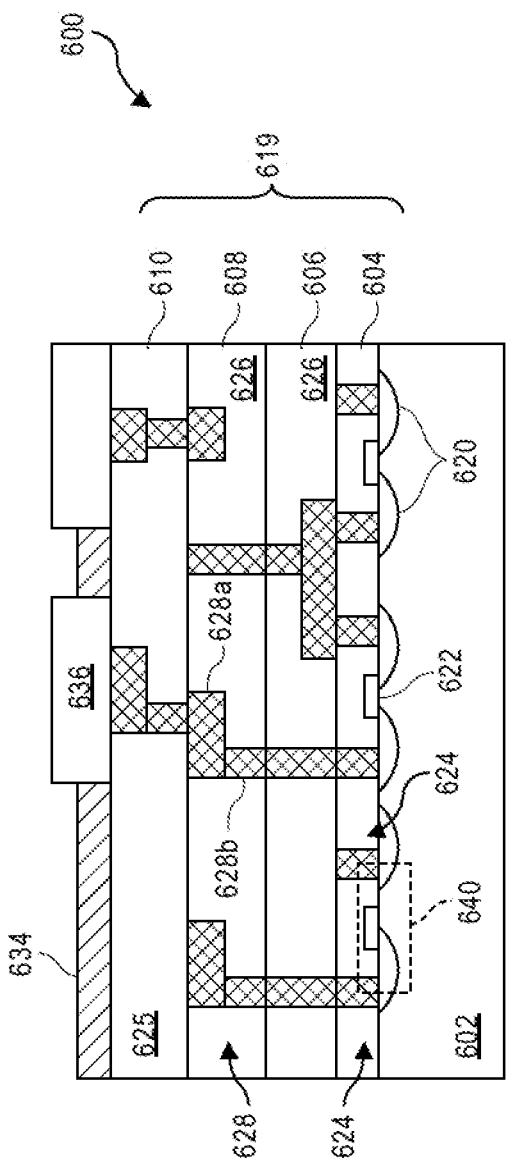
FIG. 6 is a cross-sectional side view of an integrated circuit (IC) device that may include III-V source/drain in top NMOS transistors for low temperature stacked transistor contacts, in accordance with one or more of the embodiments disclosed herein.

FIG. 6 is a cross-sectional side view of an integrated circuit (IC) device that may include III-V source/drain in top NMOS transistors, in accordance with one or more of the embodiments disclosed herein.

Referring to FIG. 6, an IC device 600 is formed on a substrate 602 (e.g., the wafer 500 of FIG. 5A) and may be included in a die (e.g., the die 502 of FIG. 5B), which may be singulated or included in a wafer. Although a few examples of materials from which the substrate 602 may be formed are described above, any material that may serve as a foundation for an IC device 600 may be used.

The IC device 600 may include one or more device layers, such as device layer 604, disposed on the substrate 602. The device layer 604 may include features of one or more transistors 640 (e.g., III-V source/drain in top NMOS transistors as described above) formed on the substrate 602. The device layer 604 may include, for example, one or more source and/or drain (S/D) regions 620, a gate 622 to control current flow in the transistors 640 between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and may include a wide variety of other types and configurations such as, for example, planar transistors, non-planar transistors, or a combination of both. Non-planar transistors may include fin-based transistors, such as double-gate transistors or tri-gate transistors, and wrap-around or all-around gate transistors, such as nanoribbon and nanowire transistors.

Electrical signals, such as power and/or input/output (I/O) signals, may be routed to and/or from the transistors 640 of the device layer 604 through one or more interconnect layers disposed on the device layer 604 (illustrated in FIG. 6 as interconnect layers 606-610). For example, electrically conductive features of the device layer 604 (e.g., the gate 622 and the S/D contacts 624) may be electrically coupled with the interconnect structures 628 of the interconnect layers 606-610. The one or more interconnect layers 606-610 may form an interlayer dielectric (ILD) stack 619 of the IC device 600.

The interconnect structures 628 may be arranged within the interconnect layers 606-610 to route electrical signals according to a wide variety of designs (in particular, the arrangement is not limited to the particular configuration of interconnect structures 628 depicted in FIG. 6). Although a particular number of interconnect layers 606-610 is depicted in FIG. 6, embodiments of the present disclosure include IC devices having more or fewer interconnect layers than depicted.

In some embodiments, the interconnect structures 628 may include trench structures 628a (sometimes referred to as "lines") and/or via structures 628b filled with an electrically conductive material such as a metal. The trench structures 628a may be arranged to route electrical signals in a direction of a plane that is substantially parallel with a surface of the substrate 602 upon which the device layer 604 is formed. For example, the trench structures 628a may route electrical signals in a direction in and out of the page from the perspective of FIG. 6. The via structures 628b may be arranged to route electrical signals in a direction of a plane that is substantially perpendicular to the surface of the substrate 602 upon which the device layer 604 is formed. In some embodiments, the via structures 628b may electrically couple trench structures 628a of different interconnect layers 606-610 together.

The interconnect layers 606-610 may include a dielectric material 626 disposed between the interconnect structures 628, as shown in FIG. 6. In some embodiments, the dielectric material 626 disposed between the interconnect structures 628 in different ones of the interconnect layers 606-610 may have different compositions; in other embodiments, the composition of the dielectric material 626 between different interconnect layers 606-610 may be the same. In either case, such dielectric materials may be referred to as inter-layer dielectric (ILD) materials.

A first interconnect layer 606 (referred to as Metal 1 or "M1") may be formed directly on the device layer 604. In some embodiments, the first interconnect layer 606 may include trench structures 628a and/or via structures 628b, as shown. The trench structures 628a of the first interconnect layer 606 may be coupled with contacts (e.g., the S/D contacts 624) of the device layer 604.

A second interconnect layer 608 (referred to as Metal 2 or "M2") may be formed directly on the first interconnect layer 606. In some embodiments, the second interconnect layer 608 may include via structures 628b to couple the trench structures 628a of the second interconnect layer 608 with the trench structures 628a of the first interconnect layer 606. Although the trench structures 628a and the via structures 628b are structurally delineated with a line within each interconnect layer (e.g., within the second interconnect layer 608) for the sake of clarity, the trench structures 628a and the via structures 628b may be structurally and/or materially contiguous (e.g., simultaneously filled during a dual-damascene process) in some embodiments.

A third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606.

The IC device 600 may include a solder resist material 634 (e.g., polyimide or similar material) and one or more bond pads 636 formed on the interconnect layers 606-610. The bond pads 636 may be electrically coupled with the interconnect structures 628 and configured to route the electrical signals of the transistor(s) 640 to other external devices. For example, solder bonds may be formed on the one or more bond pads 636 to mechanically and/or electrically couple a chip including the IC device 600 with another component (e.g., a circuit board). The IC device 600 may have other alternative configurations to route the electrical signals from the interconnect layers 606-610 than depicted in other embodiments. For example, the bond pads 636 may be replaced by or may further include other analogous features (e.g., posts) that route the electrical signals to external components.

Figure 7:
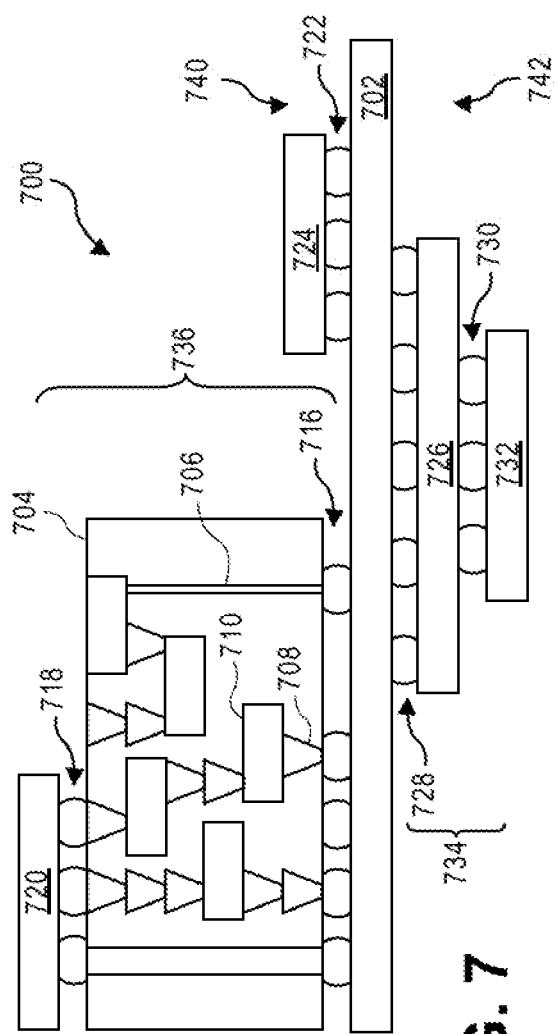
FIG. 7 is a cross-sectional side view of an integrated circuit (IC) device assembly that may include III-V source/drain in top NMOS transistors for low temperature stacked transistor contacts, in accordance with one or more of the embodiments disclosed herein.

FIG. 7 is a cross-sectional side view of an integrated circuit (IC) device assembly that may include III-V source/drain in top NMOS transistors, in accordance with one or more of the embodiments disclosed herein.

Referring to FIG. 7, an IC device assembly 700 includes components having one or more integrated circuit structures described herein. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include a number of the TFT structures 150, 170, 200 or 300 disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 502 of FIG. 5B), an IC device (e.g., the IC device 600 of FIG. 6), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through-silicon vias (TSVs) 706. The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
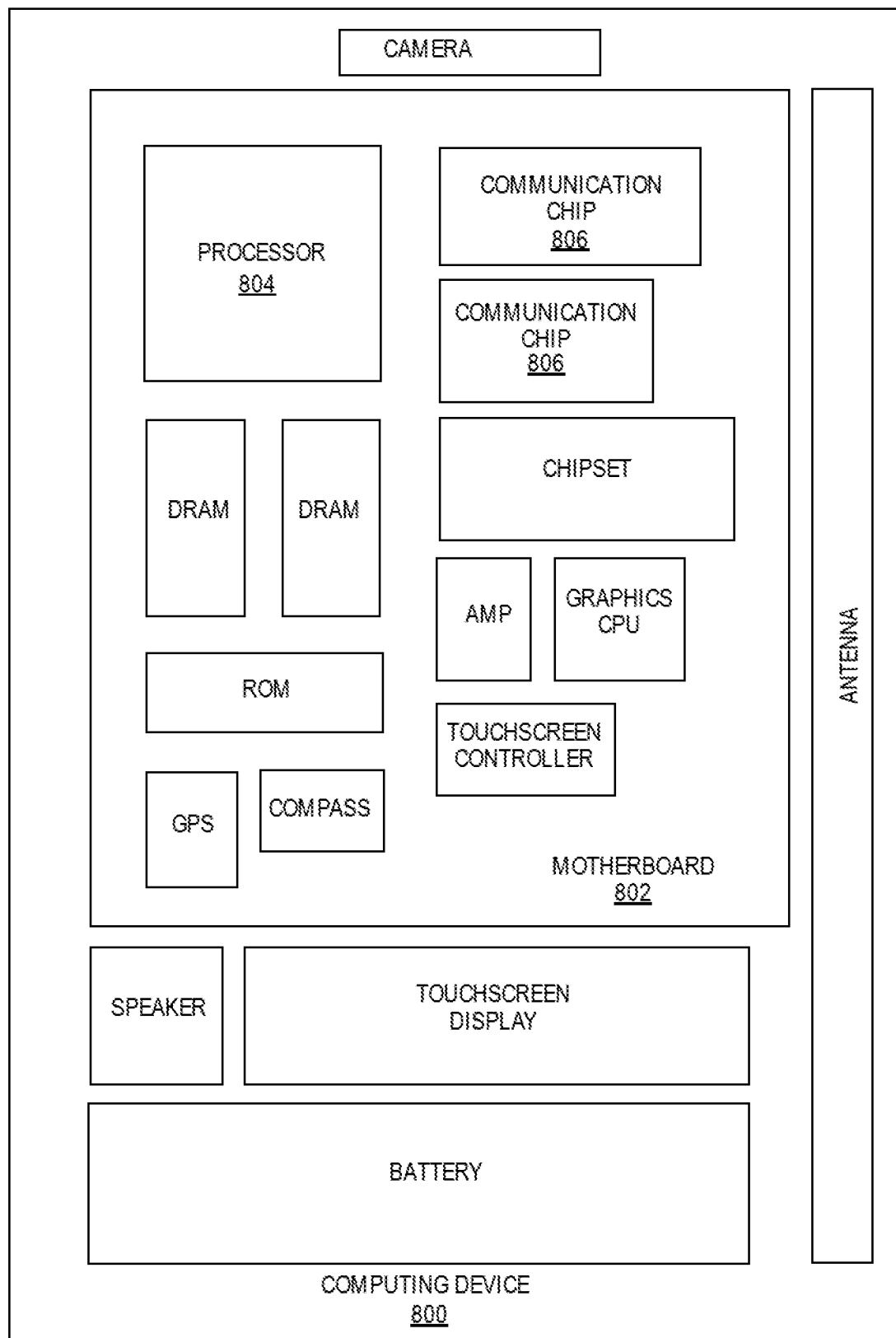
FIG. 8 illustrates a computing device in accordance with one implementation of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes III-V source/drain in top NMOS transistors, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more thin film transistors having relatively increased width, in accordance with implementations of embodiments of the disclosure.

In further implementations, another component housed within the computing device 800 may contain an integrated circuit die that includes III-V source/drain in top NMOS transistors, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments described herein III-V source/drain in top NMOS transistors. The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure comprises a lower device layer that includes a first structure comprising a plurality of PMOS transistors. An upper device layer is formed on the lower device layer, wherein the upper device layer includes a second structure comprising a plurality of NMOS thin-film transistors (TFT).

Example Embodiment 2

The integrated circuit structure of example embodiment 1, wherein the plurality of NMOS transistors are non-planar.

Example Embodiment 3

The integrated circuit structure of example embodiment 1 or 2, wherein the group III-V material source/drain region comprises a narrow band gap alloy of indium gallium arsenide ($In_xGa_yAs_y$).

Example Embodiment 4

The integrated circuit structure of example embodiment 1 or 2, wherein the group III-V material source/drain region comprises one of: indium arsenide (InAs), indium antimony (InSb), indium arsenide antimony (InAsSb), gallium arsenide (GaAs), gallium arsenide antimony (GaAsSb), indium phosphorus (InP), germanium (Ge), and silicon germanium (SiGe).

Example Embodiment 5

The integrated circuit structure of example embodiment 1, 2, 3, or 4, wherein use of the group III-V material reduces a highest temperature budget for processing a stack comprising the plurality of NMOS transistors formed on the plurality of PMOS transistors.

Example Embodiment 6

The integrated circuit structure of example embodiment 1, 2, 3, 4, or 5, wherein ones of the plurality of NMOS transistors comprise: a gate electrode formed on a gate dielectric layer formed on a fin; a pair of sidewall spacers formed along opposite sides of the gate electrode; and the group III-V source/drain region formed on opposite sides of and extending beneath the gate electrode, and wherein the group III-V source/drain region is formed adjacent to the sidewall spacers and above a top surface of the gate dielectric layer.

Example Embodiment 7

The integrated circuit structure of example embodiment 1, 2, 3, 4, 5, or 6, wherein respective ones of the plurality of NMOS transistors further include metal contacts directly contacting the group III-V material source/drain region.

Example Embodiment 8

The integrated circuit structure of example embodiment 8, wherein the upper device layer is formed on a bonding layer material that is on the lower device layer.

Example Embodiment 9

The integrated circuit structure of example embodiment 1, 2, 3, 4, 5, 6, 7 or 8, wherein the bonding layer material comprises an oxide layer.

Example Embodiment 10

The integrated circuit structure of example embodiment 1, 2, 3, 4, 5, 6, 7, 8 or 9, wherein the plurality of PMOS transistors are non-planar.

Example Embodiment 11

The integrated circuit structure of example embodiment 1, 2, 3, 4, 5, 6, 7, 8, 9, or 10, wherein ones of the plurality of PMOS transistors comprise: a gate electrode formed on a gate dielectric layer formed on a silicon layer; a pair of sidewall spacers formed along opposite sides of the gate electrode; and a pair of source/drain region formed on opposite sides of and extending beneath the gate electrode.

Example Embodiment 12

The integrated circuit structure of example embodiment 1, 2, 3, 4, 5, 6, 7, 8, 9, 10 or 11, wherein the plurality of NMOS transistors are formed as at least one of multi-gate transistors, vertical circular gate (CG) transistors, and nanowire transistors.

Example Embodiment 13

The integrated circuit structure of example embodiment 12, wherein the plurality of PMOS transistors are formed as at least one of multi-gate transistors, vertical circular gate (CG) transistors, and nanowire transistors.

Example Embodiment 14

The integrated circuit structure of example embodiment 1, 2, 3, 4, 5, 6, 7, 8, 9, 10, 11, 12, or 13 wherein the plurality of NMOS transistors and the PMOS transistors are formed as a same type of transistor architecture including at least one of finFET, multi-gate, vertical circular gate (CG), and nanowire.

Example Embodiment 15

An integrated circuit structure, comprises a lower device layer that includes a first structure comprising a plurality of PMOS transistors. Respective ones of the plurality of PMOS transistors comprise: a gate electrode formed on a gate dielectric layer formed on a silicon layer; a pair of sidewall spacers formed along opposite sides of the gate electrode; and a pair of source/drain region formed on opposite sides of and extending beneath the gate electrode. A bonding layer material is formed on the lower device layer. An upper device layer formed on the bonding layer material, the upper device layer including a second structure comprising a plurality of NMOS transistors. Respective ones of the first plurality of NMOS transistors comprise: a gate electrode formed on a gate dielectric layer formed on a fin; a pair of sidewall spacers formed along opposite sides of the gate electrode; and a group III-V material source/drain region formed on opposite sides of and extending beneath the gate electrode, and wherein the a group III-V material source/drain region is formed adjacent to the sidewall spacers and above a bottom surface of the gate dielectric layer.

Example Embodiment 16

The integrated circuit structure of example embodiment 15, wherein the respective ones of the plurality of NMOS transistors further comprise metal contacts directly contacting the group III-V material source/drain region.

Example Embodiment 17

The integrated circuit structure of example embodiment 15 or 16, wherein the group III-V material source/drain region comprises a narrow band gap alloy of indium gallium arsenide ($In_xGa_yAs_y$).

Example Embodiment 18

The integrated circuit structure of example embodiment 15 or 16, wherein the group III-V material source/drain region comprises one of: indium arsenide (InAs), indium antimony (InSb), indium arsenide antimony (InAsSb), gallium arsenide (GaAs), gallium arsenide antimony (GaAsSb), indium phosphorus (InP), germanium (Ge), and silicon germanium (SiGe).

Example Embodiment 19

The integrated circuit structure of example embodiment 15, 16, 17, or 18, wherein use of the group III-V material reduces a highest temperature budget for processing a stack comprising the plurality of NMOS transistors formed on the plurality of PMOS transistors.

Example Embodiment 20

The integrated circuit structure of example embodiment 15, 16, 17, 18, or 19, wherein the plurality of NMOS transistors are formed as at least one of multi-gate transistors, vertical circular gate (CG) transistors, and nanowire transistors.

Example Embodiment 21

The integrated circuit structure of example embodiment, 15, 16, 17, 18, 19 or 20, wherein the plurality of PMOS transistors are formed as at least one of multi-gate transistors, vertical circular gate (CG) transistors, and nanowire transistors. Example embodiment 22: The integrated circuit structure of example embodiment 15, 16, 17, 18, 19, 20 or 21, wherein the plurality of NMOS transistors and the plurality of PMOS transistors are formed as a same type of transistor architecture including at least one of finFET, multi-gate, vertical circular gate (CG), and nanowire.

Example Embodiment 23

A method of fabricating an integrated device structure comprising a vertically stacked transistor device architecture. The method comprises forming a lower device layer that includes a first structure comprising a plurality of PMOS transistors. A bonding layer material is formed on the lower device layer. An upper device layer is formed on the bonding layer material, the upper device layer including a second structure comprising a plurality of NMOS transistors having a group III-V material source/drain region.

Example Embodiment 24

The method of example embodiment 23, further comprising forming respective ones of the first plurality of NMOS transistors by: etching silicon from the bonding layer material to form a silicon fin; patterning a channel mask to protect a portion of the fin that is to become the channel region; recess etching portions of the fin not protected by the channel mask to form recesses; epitaxially growing the III-V semiconductor material on surfaces of the fin not protected by the channel mask; and replacing the channel mask with a permanent gate stack and forming contact metallization.

Example Embodiment 25

The method of example embodiment 24, wherein epitaxially growing the III-V semiconductor material further comprises epitaxially growing at least one of $In_xGa_yAs_y$, indium arsenide (InAs), indium antimony (InSb), indium arsenide antimony (InAsSb), gallium arsenide (GaAs), gallium arsenide antimony (GaAsSb), indium phosphorus (InP), germanium (Ge), or silicon germanium (SiGe).

What is claimed is:

1. An integrated circuit structure, comprising:
    a lower device layer that includes a first structure comprising a plurality of PMOS transistors, wherein respective ones of the plurality of PMOS transistors comprise:
        a gate electrode formed on a gate dielectric layer formed on a silicon layer;
        a pair of sidewall spacers formed along opposite sides of the gate electrode; and
        a pair of source/drain regions formed on opposite sides of and extending beneath the gate electrode;
    a bonding layer material formed on the lower device layer; and
    an upper device layer formed on the bonding layer material, the upper device layer including a second structure comprising a plurality of NMOS transistors, wherein respective ones of the plurality of NMOS transistors comprise:
        a gate electrode formed on a gate dielectric layer formed on a fin;
        a pair of sidewall spacers formed along opposite sides of the gate electrode;
        a group III-V material source/drain region formed on opposite sides of and extending beneath the gate electrode, and wherein the a group III-V material source/drain region is formed adjacent to the sidewall spacers and above a bottom surface of the gate dielectric layer, wherein the pair of sidewall spacers provide 2-5 nm of lateral spacing between gate electrode and group III-V material source/drain region; and
        a metal contact directly contacting the group III-V material source/drain region, wherein source/drain region has a contact resistivity between approximately 3e-10 and 1e-8 $\Omega\text{-cm}^2$.

2. The integrated circuit structure of claim 1, wherein the plurality of NMOS transistors are non-planar.

3. The integrated circuit structure of claim 1, wherein the bonding layer material comprises an oxide layer.

4. The integrated circuit structure of claim 1, wherein the plurality of PMOS transistors are non-planar.

5. The integrated circuit structure of claim 1, wherein the second plurality of NMOS transistors are formed as at least one of multi-gate transistors, vertical circular gate (CG) transistors, and nanowire transistors.

6. The integrated circuit structure of claim 1, wherein the plurality of PMOS transistors are formed as at least one of multi-gate transistors, vertical circular gate (CG) transistors, and nanowire transistors.

7. The integrated circuit structure of claim 1, wherein both the second plurality of NMOS transistors are formed as a same type of transistor architecture including at least one of finFET, multi-gate, vertical circular gate (CG), and nanowire.

8. The integrated circuit structure of claim 1, wherein the group III-V material source/drain region comprises a narrow band gap alloy of indium gallium arsenide ($In_xGa_yAs_y$).

9. The integrated circuit structure of claim 1, wherein the group III-V material source/drain region comprises one of: indium arsenide (InAs), indium antimony (InSb), indium arsenide antimony (InAsSb), gallium arsenide (GaAs), gallium arsenide antimony (GaAsSb), indium phosphorus (InP).

10. The integrated circuit structure of claim 1, wherein the plurality of NMOS transistors are formed as at least one of multi-gate transistors, vertical circular gate (CG) transistors, and nanowire transistors.

11. The integrated circuit structure of claim 1, wherein the plurality of PMOS transistors are formed as at least one of multi-gate transistors, vertical circular gate (CG) transistors, and nanowire transistors.

12. The integrated circuit structure of claim 1, wherein the plurality of NMOS transistors and the plurality of PMOS transistors are formed as a same type of transistor architecture including at least one of finFET, multi-gate, vertical circular gate (CG), and nanowire.

13. A method of fabricating an integrated device structure comprising a vertically stacked transistor device architecture, the method comprising:
    forming a lower device layer that includes a first structure comprising a plurality of PMOS transistors, wherein respective ones of the plurality of PMOS transistors comprise:
        a gate electrode formed on a gate dielectric layer formed on a silicon layer;
        a pair of sidewall spacers formed along opposite sides of the gate electrode; and
        a pair of source/drain regions formed on opposite sides of and extending beneath the gate electrode;
    forming a bonding layer material formed on the lower device layer; and
    forming an upper device layer formed on the bonding layer material, the upper device layer including a second structure comprising a plurality of NMOS transistors, wherein respective ones of the plurality of NMOS transistors comprise:
        a gate electrode formed on a gate dielectric layer formed on a fin;
        a pair of sidewall spacers formed along opposite sides of the gate electrode; and
        a group III-V material source/drain region formed on opposite sides of and extending beneath the gate electrode, and wherein the a group III-V material source/drain region is formed adjacent to the sidewall spacers and above a bottom surface of the gate dielectric layer, wherein the pair of sidewall spacers provide 2-5 nm of lateral spacing between gate electrode and group III-V material source/drain region; and a metal contact directly contacting the group III-V material source/drain region, wherein source/drain region has a contact resistivity between approximately 3e-10 and 3e-10 and 1e-8 $\Omega$-cm$^2$.

14. The method of claim 13, further comprising forming ones of the plurality of NMOS transistors by:

etching silicon from the bonding layer material to form a silicon fin;

patterning a channel mask to protect a portion of the fin that is to become the channel region;

recess etching portions of the fin not protected by the channel mask to form recesses;

epitaxially growing the III-V semiconductor material on surfaces of the fin not protected by the channel mask; and replacing the channel mask with a permanent gate stack and forming contact metallization.

15. The method of claim 14, wherein epitaxially growing the III-V semiconductor material further comprises epitaxially growing at least one of $In_xGa_yAs_y$, indium arsenide (InAs), indium antimony (InSb), indium arsenide antimony (InAsSb), gallium arsenide (GaAs), gallium arsenide antimony (GaAsSb), indium phosphorus (InP).

\* \* \* \* \*